(12) United States Patent
Xu et al.

(10) Patent No.: US 12,334,345 B2
(45) Date of Patent: Jun. 17, 2025

(54) DYNAMIC RANDOM ACCESS MEMORY DEVICE WITH ACTIVE REGIONS OF DIFFERENT PROFILE ROUGHNESS AND METHOD FOR FORMING THE SAME

(71) Applicant: Fujian Jinhua Integrated Circuit Co., Ltd., Quanzhou (CN)

(72) Inventors: Yaoguang Xu, Jinjiang (CN); Hsien-Shih Chu, Kaohsiung (TW); Yun-Fan Chou, Taichung (TW); Yu-Cheng Tung, Kaohsiung (TW); Chaoxiong Wang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 430 days.

(21) Appl. No.: 17/386,575

(22) Filed: Jul. 28, 2021

(65) Prior Publication Data
US 2022/0384191 A1 Dec. 1, 2022

(30) Foreign Application Priority Data
May 27, 2021 (CN) .......................... 202110587180.8
May 27, 2021 (CN) .......................... 202121165979.X

(51) Int. Cl.
*H01L 21/033* (2006.01)
*H10B 12/00* (2023.01)

(52) U.S. Cl.
CPC ...... *H01L 21/0338* (2013.01); *H01L 21/0332* (2013.01); *H01L 21/0335* (2013.01); *H01L 21/0337* (2013.01); *H10B 12/00* (2023.02)

(58) Field of Classification Search
CPC ............. H01L 21/0338; H01L 21/0332; H01L 21/0335; H01L 21/0337; H10B 12/00
See application file for complete search history.

(56) References Cited

U.S. PATENT DOCUMENTS

| | | | | |
|---|---|---|---|---|
| 5,849,638 | A * | 12/1998 | Ho | H01L 28/82 257/E21.549 |
| 9,768,175 | B2 * | 9/2017 | Wu | H01L 29/4236 |
| 10,846,451 | B1 * | 11/2020 | Kolnik | G06F 30/367 |
| 2008/0258268 | A1 * | 10/2008 | Cheng | H10B 12/0387 438/386 |
| 2008/0280409 | A1 * | 11/2008 | Parekh | H01L 27/1207 438/257 |
| 2010/0109162 | A1 * | 5/2010 | Hwang | H10B 12/00 257/773 |
| 2017/0200722 | A1 * | 7/2017 | Wu | H01L 21/764 |
| 2022/0045071 | A1 * | 2/2022 | He | H10B 12/053 |

OTHER PUBLICATIONS

IPSearchDownload2023122900207.pdf (Year: 2023).*

* cited by examiner

*Primary Examiner* — Shaun M Campbell
*Assistant Examiner* — David Paul Sedorook
(74) *Attorney, Agent, or Firm* — Winston Hsu

(57) ABSTRACT

A DRAM includes a substrate, a plurality of first active regions disposed on the substrate and arranged end-to-end along the first direction, and a plurality of second active regions disposed between the first active regions and arranged end-to-end along the first direction. The second active regions respectively have a first sidewall adjacent to a first trench between the second active region and one of the first active regions and a second sidewall adjacent to a second trench between the ends of the first active regions, wherein the second sidewall is taper than the first sidewall in a cross-sectional view.

14 Claims, 7 Drawing Sheets

DYNAMIC RANDOM ACCESS MEMORY DEVICE WITH ACTIVE REGIONS OF DIFFERENT PROFILE ROUGHNESS AND METHOD FOR FORMING THE SAME

BACKGROUND OF THE INVENTION

1. Field of the Invention

The present invention relates to a semiconductor structure and method for forming the same. More particularly, the present invention relates to a dynamic random access memory (DRAM) and method for forming the same.

2. Description of the Prior Art

Dynamic random access memory (DRAM) is one kind of volatile memory. A DRAM device usually includes an array region comprising plural memory cells and a peripheral region comprising control circuit. The control circuits in the peripheral region may address each of the memory cells in the array region by plural columns of word lines and plural rows of bit lines traversing the array region and electrically connected to each of the memory cells to perform reading, writing or erasing data. In advanced semiconductor manufacturing, the chip size of a DRAM device may be dramatically scaled down by adopting buried word-line or buried bit-lines architectures, by which the active areas of the memory cells may be arranged at a dense pitch for higher cell density. However, the manufacturing process of DRAMs has been more and more complicated to realize the above architectures.

SUMMARY OF THE INVENTION

It is one objective of the present invention to provide a dynamic random access memory (DRAM) having a unique structure and method for forming the same.

According to one embodiment of the present invention, a dynamic random access memory (DRAM) is disclosed. The DRAM includes a substrate, a plurality of first active regions disposed on the substrate and arranged end-to-end along the first direction, and a plurality of second active regions disposed between the first active regions and arranged end-to-end along the first direction. The second active regions respectively have a first sidewall adjacent to a first trench between the second active region and one of the first active regions and a second sidewall adjacent to a second trench between the ends of the first active regions, wherein the second sidewall is taper than the first sidewall in a cross-sectional view.

According to another embodiment of the present invention, a dynamic random access memory (DRAM) is disclosed. The DRAM includes a substrate, a plurality of first active regions disposed on the substrate, wherein the first active regions respectively extend along a first direction and are arranged end-to-end along the first direction, and a plurality of second active regions disposed between the first active regions and arranged end-to-end along the first direction, wherein the first active regions and the second active regions are alternately and staggered arranged along a second direction, the first direction and the second direction are perpendicular, and a profile roughness of the first active regions and a profile roughness of the second active regions are different from a top plan view.

According to still another embodiment of the present invention, a method for forming a dynamic random access memory is disclosed and includes the steps of providing a substrate, successively forming oxide layer, a polysilicon layer, and a nitride layer on the substrate, performing a self-aligned reverse patterning (SARP) process to form a plurality of mandrel structures and a plurality of non-mandrel structures on the nitride layer, using the mandrel structures and the non-mandrel structures as an etching mask to etch the nitride layer to form a plurality of first nitride patterns and a plurality of second nitride patterns, wherein the second nitride patterns are covered by a remaining portion of the non-mandrel structures, using the first nitride patterns, the second nitride patterns and the remaining portion of the non-mandrel structures as an etching mask to etch the polysilicon layer to form a plurality of first polysilicon patterns and a plurality of second polysilicon patterns, wherein sidewalls of the first polysilicon patterns and sidewalls of the second polysilicon patterns are covered by a sidewall polymer layer, respectively, and using the first polysilicon patterns, the second polysilicon patterns, and the sidewall polymer layer as an etching mask to etch the oxide layer to form a plurality of first oxide patterns and a plurality of second oxide patterns.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 to FIG. 10 are schematic diagrams illustrating a process for forming a dynamic random access memory (DRAM) according to an embodiment of the present invention, in which:

FIG. 1 illustrates a top plan view and a cross-sectional view of a substrate at a beginning step of the process;

FIG. 2 illustrates a top plan view and a cross-sectional view of the step of forming an oxide layer, a polysilicon layer, a nitride layer and mandrel structures on the substrate;

FIG. 3 illustrates a top plan view and a cross-sectional view of the step of forming an oxide liner on the mandrel structures;

FIG. 4 illustrates a top plan view and a cross-sectional view of the step of forming a filling layer on the oxide liner;

FIG. 5 illustrates a top plan view and a cross-sectional view of the step of etching back the filling layer until exposing the oxide liner on top surfaces of the mandrel structures;

FIG. 6 illustrates a top plan view and a cross-sectional view of the step of removing the oxide liner on the top surfaces and sidewalls of the mandrel structures;

FIG. 7 illustrates a top plan view and a cross-sectional view of the step of performing a nitride etching process and a fin cut process to pattern the nitride layer;

FIG. 8 illustrates a top plan view and a cross-sectional view of the step of performing an etching process to etch and pattern the polysilicon layer.

FIG. 9 illustrates a top plan view and a cross-sectional view of performing an etching process to etch and pattern the oxide layer.

FIG. 10 illustrates a top plan view and a cross-sectional view of performing an etching process to etch and pattern the substrate and an etching process to remove the remaining oxide layer on the substrate.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

FIG. 1 to FIG. 10 are schematic diagrams illustrating the steps for forming a dynamic random access memory (DRAM) according to an embodiment of the present invention. The left portions of FIG. 1 to FIG. 10 are top plan views of a portion of the DRAM at different process steps. The right portions of FIG. 1 to FIG. 10 are cross-sectional views of a portion of the DRAM taken along the line AA in the corresponding top plan views. The first direction Y, the second direction X, and the third direction Z are shown in the diagrams for the ease of understanding the arrangement of the features. According to an embodiment, the first direction Y and the second direction X are perpendicular to each other, and the third direction Z is perpendicular to the plane defined by the first direction Y and the second direction X. The line AA is substantially parallel to the second direction X.

Figure 1:
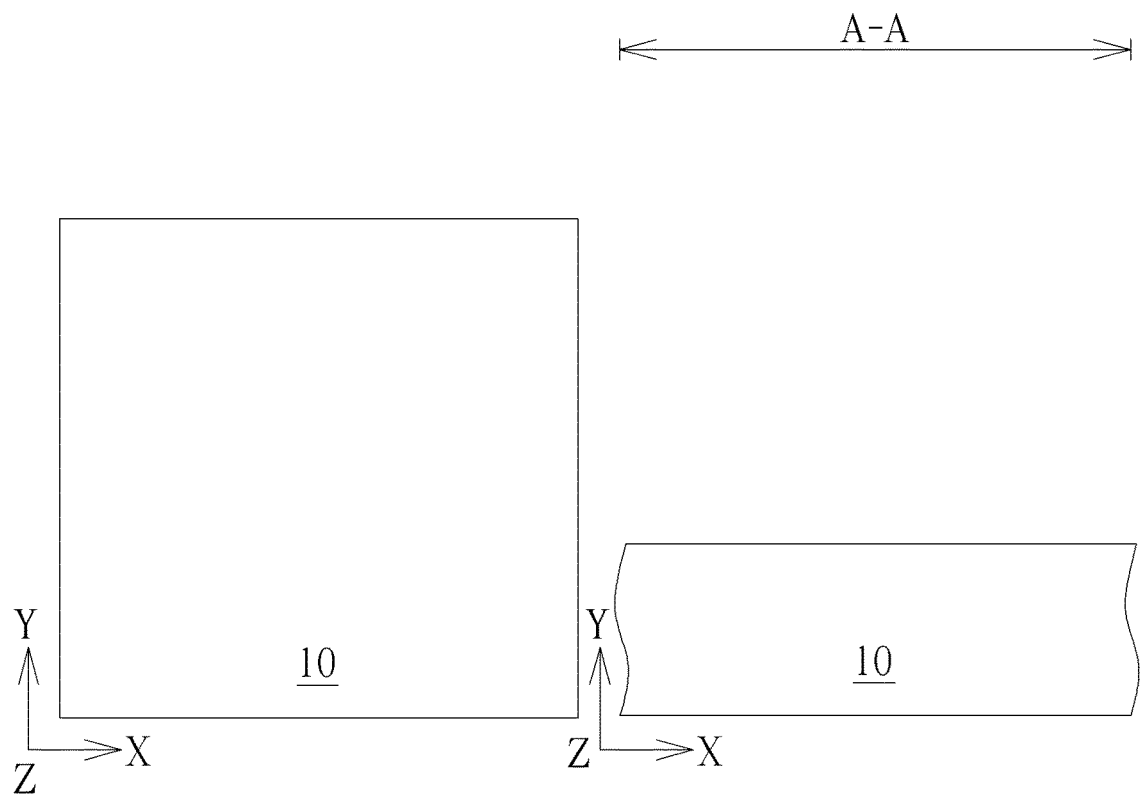

Please refer to FIG. 1. A substrate 10 is provided. The substrate 10 may be a silicon substrate, an epitaxial substrate, a silicon germanium substrate, a silicon carbide substrate, or a silicon-on-insulator (SOI) substrate, but is not limited thereto.

Figure 2:
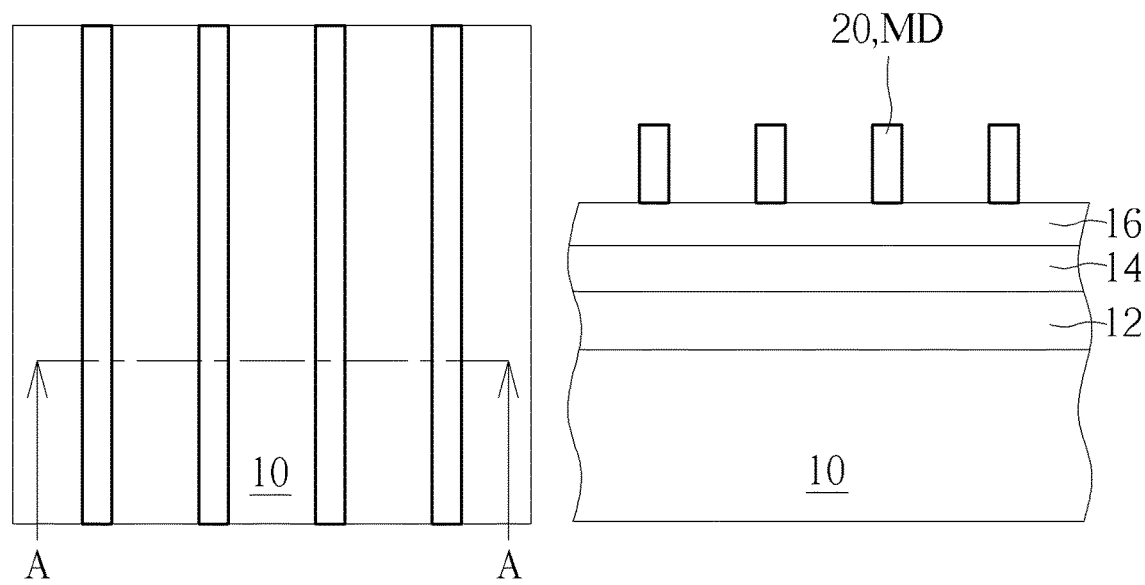

Please refer to FIG. 2. Subsequently, an oxide layer 12, a polysilicon layer 14, and a nitride layer 16 are successively formed on the substrate 10. After that, a plurality of mandrel structures MD are formed on the nitride layer 16. According to an embodiment, the method for forming the mandrel structures MD may include the steps of forming a mandrel material layer 20 completely covering the nitride layer 16 and then performing a patterning process to remove unnecessary mandrel material layer 20 to obtain the mandrel structures MD. According to an embodiment, the material of the mandrel material layer 20 may include an organic dielectric layer (ODL), but is not limited thereto.

Figure 3:
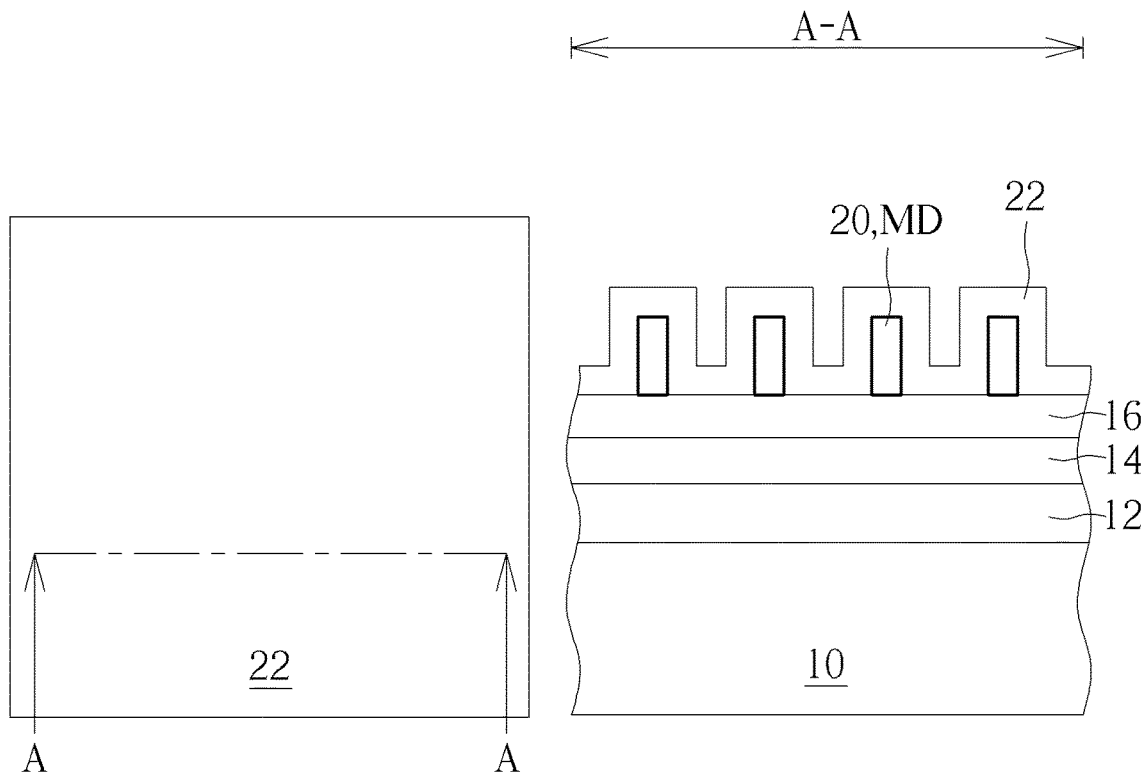

Please refer to FIG. 3. Subsequently, an oxide liner 22 is formed on the nitride layer 16 and conformally covering the sidewalls and top surfaces of the mandrel structures MD. It is important to control the thickness of the oxide liner 22 to leave spaces between the mandrel structures MD.

Figure 4:
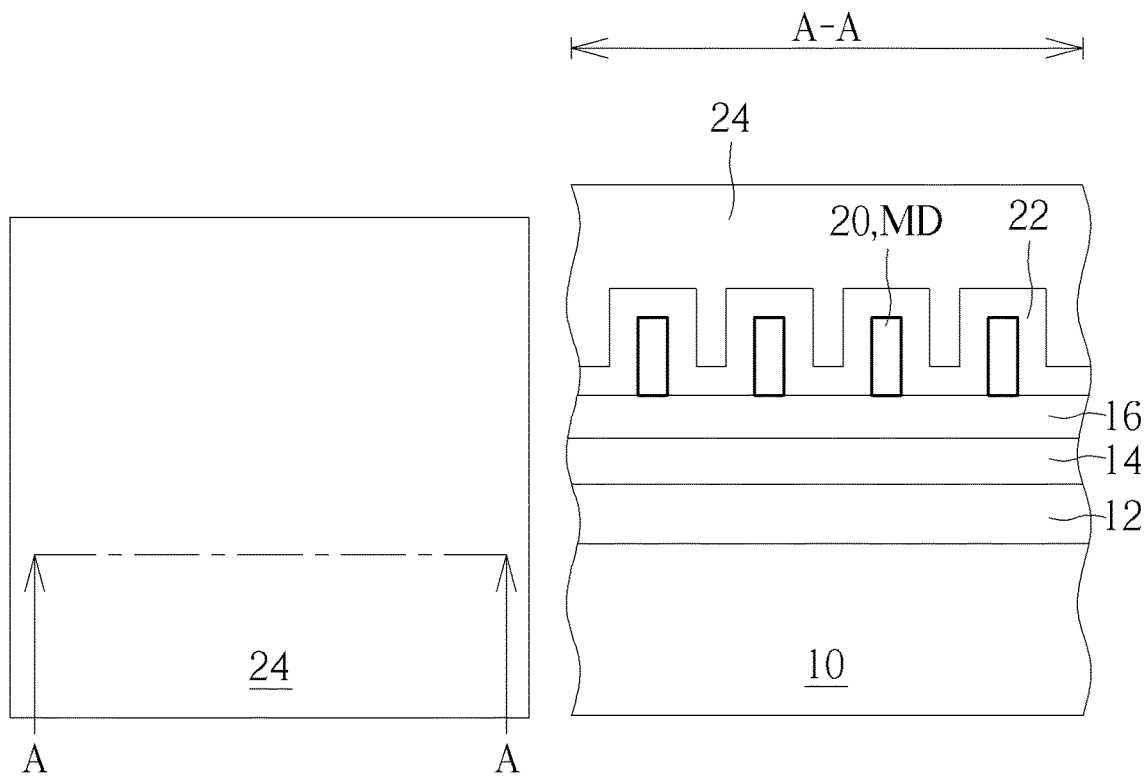

Please refer to FIG. 4. Subsequently, a filling layer 24 is formed on the oxide liner 22 in a blanket manner to completely fill the spaces between the mandrel structures MD. According to an embodiment, the filling layer 24 and the mandrel material layer 20 may include a same material, such as an organic dielectric layer (ODL), but is not limited thereto.

Figure 5:
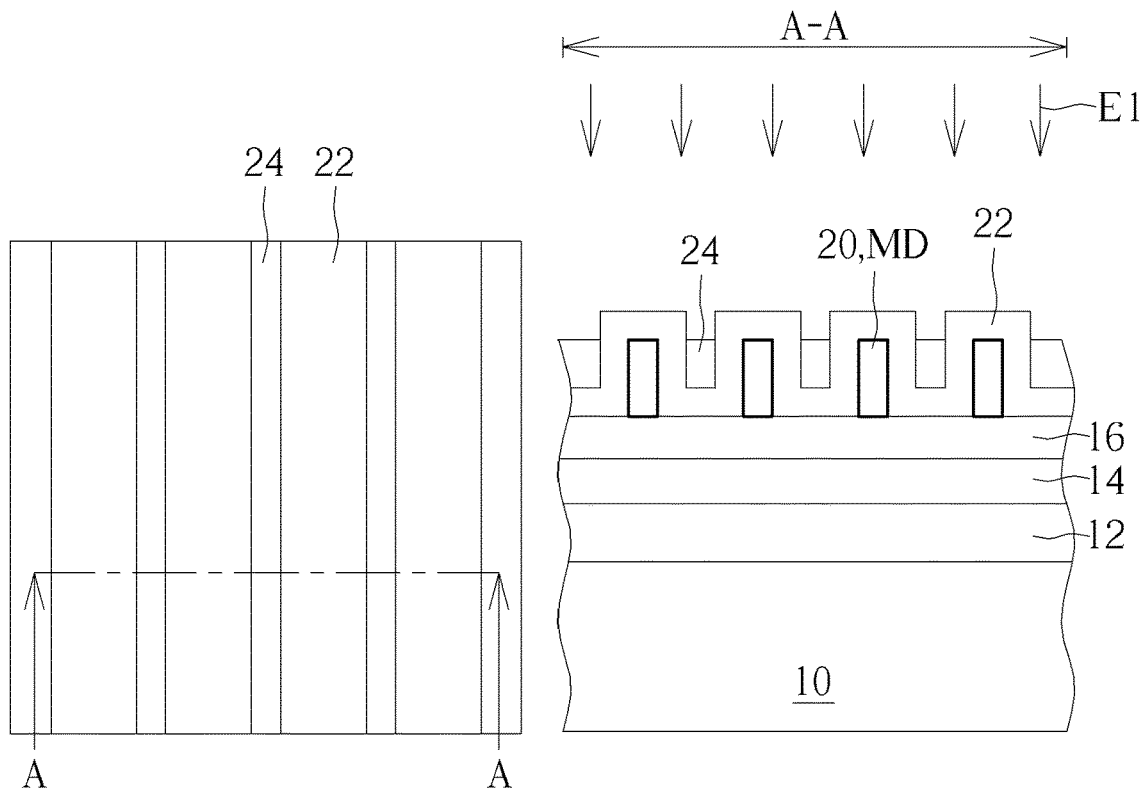

Please refer to FIG. 5. Subsequently, an etching back process E1 such as a dry etching process may be performed to remove a portion of the filling layer 24 until the oxide liner 22 on the top surfaces of the mandrel structures MD are exposed. According to an embodiment, the filling layer 24 filling the spaces between the mandrel structures MD may be recessed to be lower than the oxide liner 22 on the top surfaces of the mandrel structures MD and approximately flush with the top surfaces of the mandrel structures MD.

Figure 6:
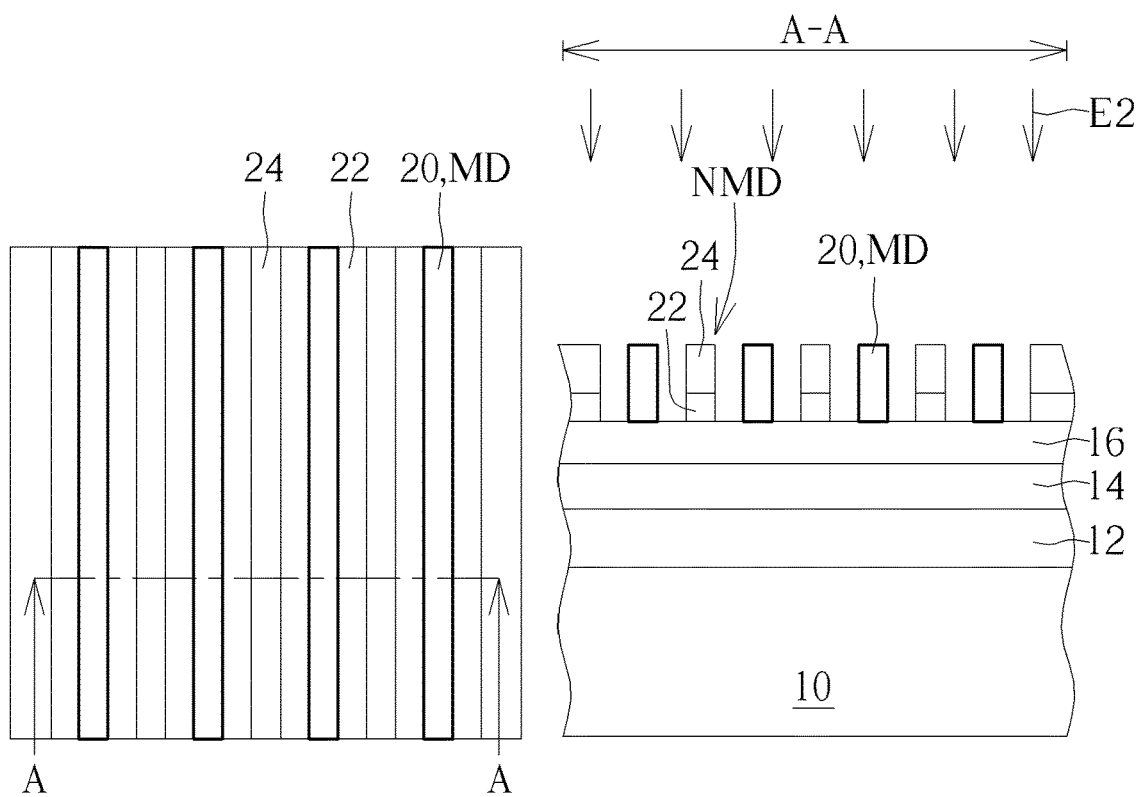

Please refer to FIG. 6. Subsequently, an etching process E2 such as a dry etching process may be performed to remove the exposed portion of the oxide liner 22 on the top surfaces and sidewalls of the mandrel structures MD until the mandrel structures MD are exposed thereby forming a plurality of non-mandrel structures NMD alternately arranged between the mandrel structures MD. As shown in FIG. 6, the non-mandrel structures NMD respectively include a lower portion made by the oxide liner 22 and an upper portion on the lower portion made by the filling layer 24. The process from FIG. 2 to FIG. 6 may be referred to as a self-aligned reverse patterning (SARP) process. According to an embodiment, the mandrel structures MD and the non-mandrel structures NMD may have substantially a same height.

Figure 7:
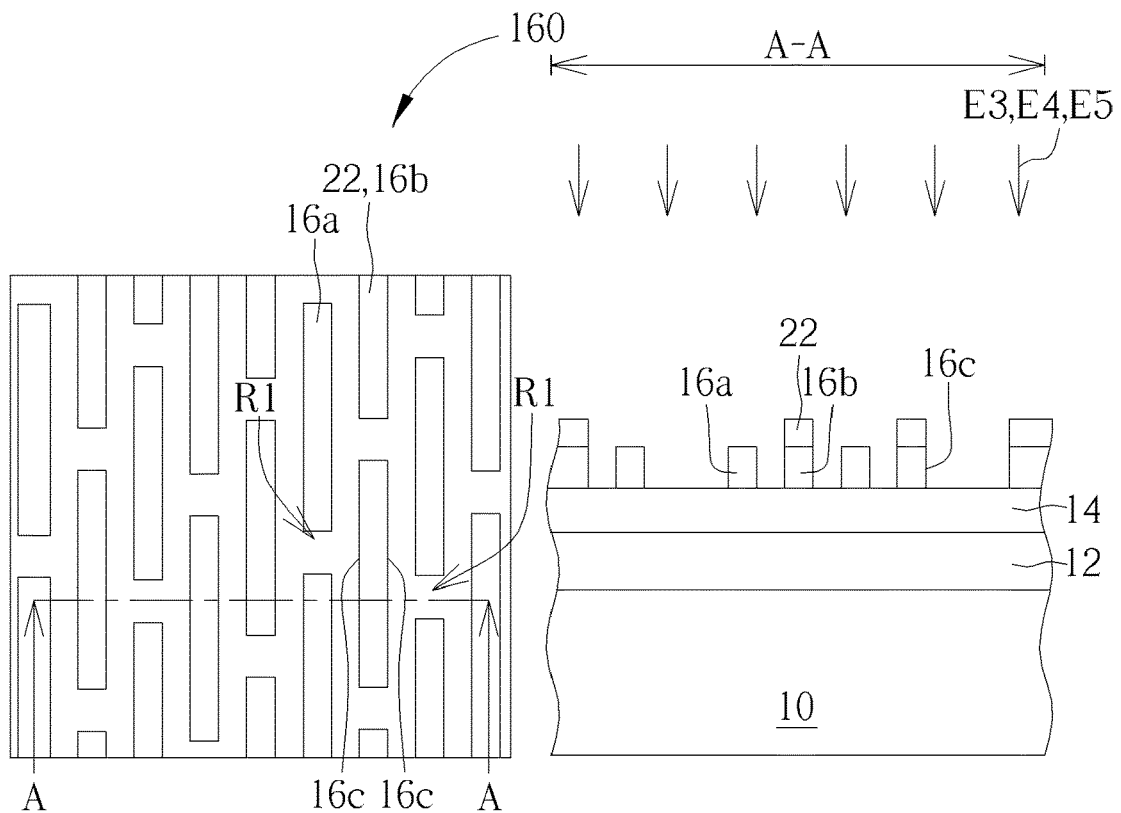

Please refer to FIG. 7. Subsequently, an etching process E3 such as a dry etching process may be performed to pattern the nitride layer 16 by using the mandrel structures MD and the non-mandrel structures NMD as an etching mask to etch and transfer the patterns of the mandrel structures MD and the non-mandrel structures NMD to the nitride layer 16 into the nitride layer 16. After the etching process, a plasma ashing process E4 may be performed to remove the remaining portions of the mandrel structures MD and the non-mandrel structures NMD, and a fin cut process E5 may be performed to remove predetermined portions of the patterned nitride layer 16 to form the first nitride patterns 16a and the second nitride patterns 16b, thereby obtaining an array pattern 160. According to an embodiment, the etching process E3 and the fin cut process E5 may utilize $CH_2F_2$, $CHF_3$, and/or $CF_4$ in combination with other gases to etch the nitride layer 16. The plasma ashing process E4 may utilize oxygen plasma to remove the remaining portions of the mandrel structures MD and the non-mandrel structures NMD.

As shown in the left portion of FIG. 7, the array pattern 160 includes a plurality of first nitride patterns 16a corresponding to the mandrel structures MD and a plurality of second nitride patterns 16b corresponding to the non-mandrel structures NMD. The first nitride patterns 16a respectively have a length extending along the first direction Y and are arranged end-to-end along the first direction Y. The second nitride patterns 16b are disposed between the first nitride patterns 16a, and respectively have a length extend along the first direction Y and are arranged end-to-end along the first direction. The first nitride patterns 16a and the second nitride patterns 16b are staggered and alternately arranged along the second direction X. It is noteworthy that, the each of the second nitride patterns 16b has two sidewall portions 16c corresponding to the cut regions R1 between the ends of the first nitride patterns 16a. The two sidewall portions 16c are not aligned along the second direction X.

It is noteworthy that, as shown in the right portion of FIG. 7, a portion of the oxide liner 22 may remain on the second nitride patterns 16b after the plasma ashing process E4 and the fin-cut process E5.

Figure 8:
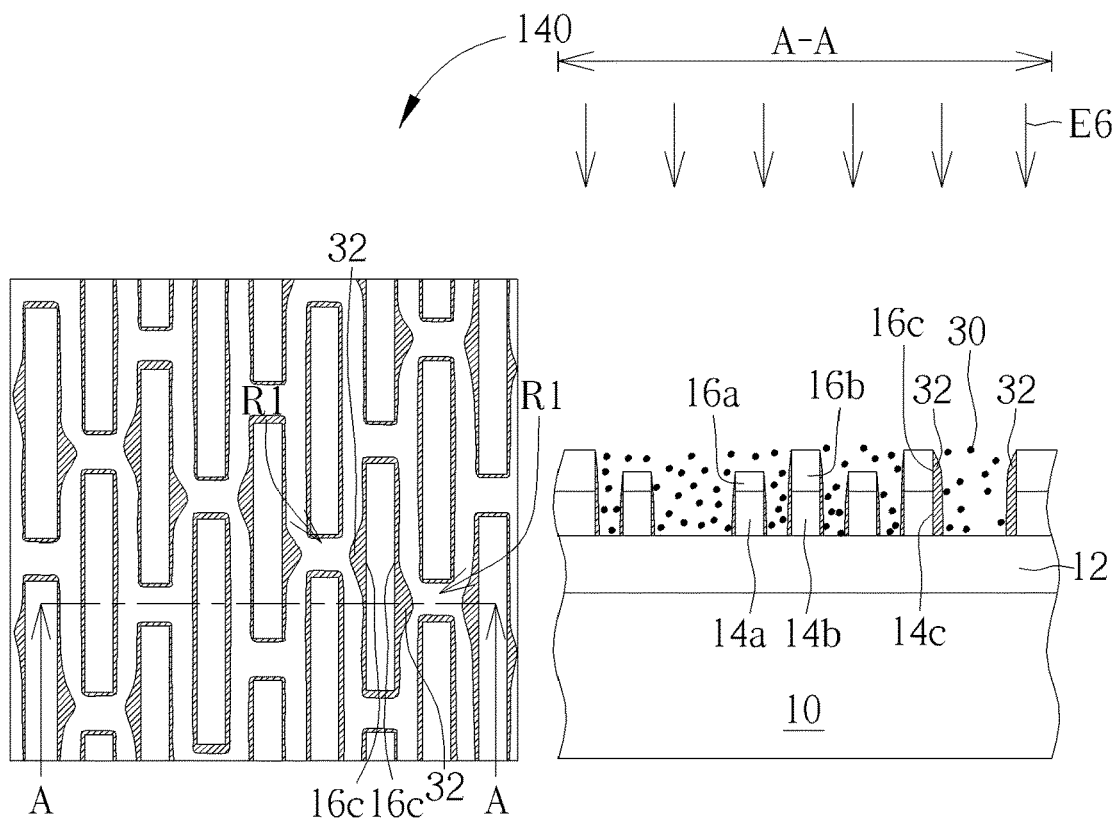

Please refer to FIG. 8. Subsequently, an etching process E6 such as a dry etching process may be performed to pattern the polysilicon layer 14 by using the first nitride patterns 16a and the second nitride patterns 16b as an etching mask to etch the polysilicon layer 14 and transfer the array pattern 160 to the polysilicon layer 14 to form an array pattern 140. The array pattern 140 comprises a plurality of first polysilicon patterns 14a corresponding to the first nitride patterns 16a and a plurality of second polysilicon patterns 14b corresponding to the second nitride patterns 16b. Each of the second polysilicon patterns 14b has two sidewall portions 14c corresponding to the cut regions R1 between the ends of the first polysilicon patterns 14a. The two sidewall portions 14c are not aligned along the second direction X.

According to an embodiment, during the etching process E6, the oxide liner 22 (shown in FIG. 7) on the second nitride patterns 16b may provide additional masking to the second nitride patterns 16b. As a result, after the etching process E6, the thickness of the second nitride patterns 16b remaining on the second polysilicon patterns 14b may be larger than the thickness of the first nitride patterns 16a remaining on the first polysilicon patterns 14a.

According to an embodiment, the etching process E6 may utilize HBr or HBr in combination with other gases to etch the polysilicon layer 14, and may produce etching by-products 30, such as $SiBr_x$ and/or other polymer by-products, in the etching chamber of the etching process E6. A portion of the etching by-products 30 may be deposited and become sidewall polymer layers 32 on sidewalls of the first polysilicon patterns 14a and the second polysilicon patterns 14b.

According to an embodiment, because of more oxide liner 22 remaining on the second nitride patterns 16b and more polysilicon layer 14 to be removed in the cut region R1, and/or the loading effect of the etching process E6, the etching by-products 30 may have a higher concentration in the cut regions R1 than in other regions of the array pattern 140. Accordingly, more etching by-products 30 may be deposited on the sidewall portions 14c of the second polysilicon patterns 14b corresponding to the cut regions R1. As a result, the sidewall polymer layer 32 on the sidewall portions 14c of the second polysilicon patterns 14b may have a thickness larger than the sidewall polymer layer 32 on other sidewall portions of the second polysilicon patterns 14b and on the sidewalls of the first polysilicon patterns 14a.

Figure 9:
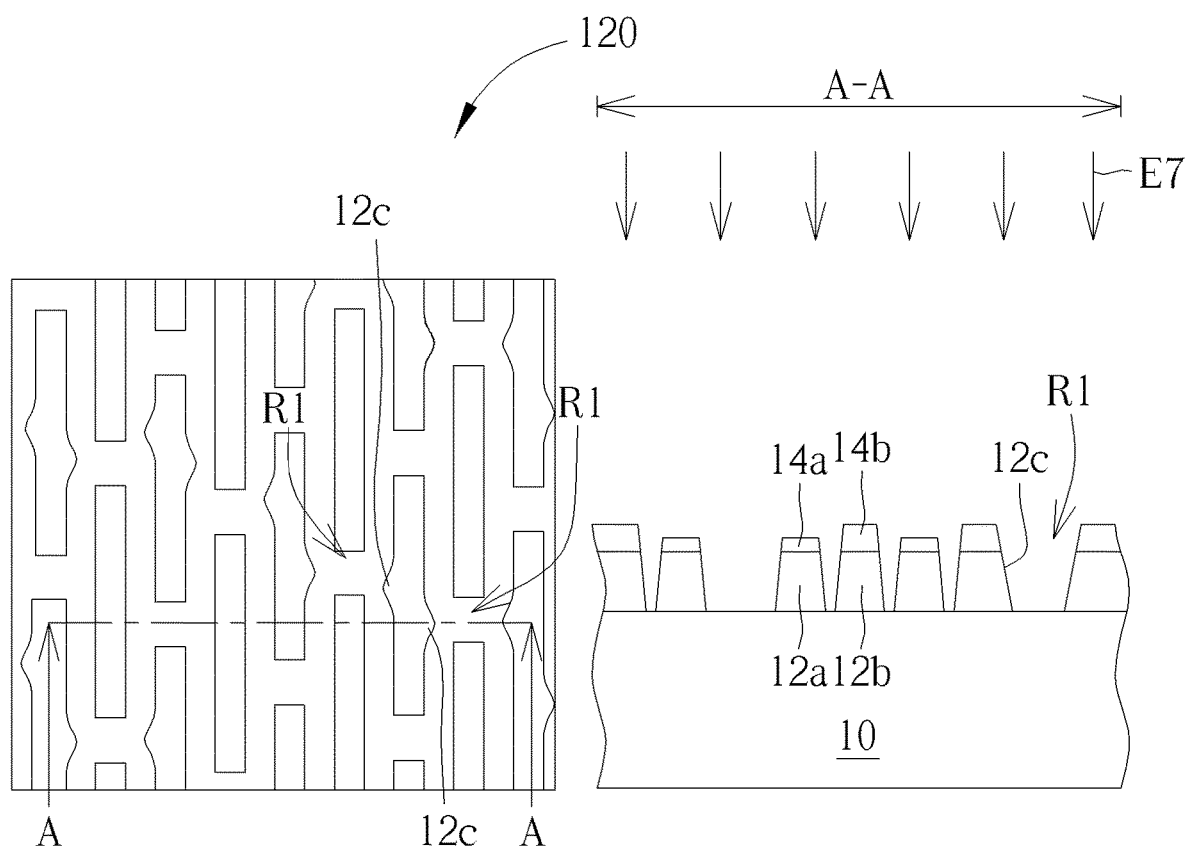

Please refer to FIG. 9. Subsequently, an etching process E7 such as a dry etching process may be performed to pattern the oxide layer 12 by using the first polysilicon patterns 14a, the second polysilicon patterns 14b, and the sidewall polymer layers 32 on sidewalls of the first polysilicon patterns 14a and sidewalls of the second polysilicon patterns 14b as an etching mask to etch the oxide layer 12 and transfer the array pattern 140 to the oxide layer 12 to form an array pattern 120. The array pattern 120 comprises a plurality of first oxide pattern 12a corresponding to the first polysilicon patterns 14a and a plurality of second oxide pattern 12b corresponding to the second polysilicon patterns 14b. According to an embodiment, the etching process E7 may utilize $CH_2F_2$, $CHF_3$, and/or $CF_4$ in combination with other gases to etch the oxide layer 12, but is not limited thereto.

According to an embodiment, the first nitride patterns 16a and the second nitride patterns 16b may provide additional masking during the etching process E7. Accordingly, as shown in FIG. 9, after the etching process E7, the thickness of the second polysilicon pattern 14b on the second oxide pattern 12b may be larger than the thickness of the first polysilicon pattern 14a on the first oxide pattern 12a.

It is noteworthy that, due to the masking of the sidewall polymer layers 32 during the etching process E7, each of the second oxide pattern 12b of the array pattern 120 may have two swelling portions 12c corresponding to the cut regions R1 between the ends of the first oxide pattern 12a. The two swelling portions 12c are not aligned along the second direction X. Along the second direction X, the second oxide patterns 12b may respectively have a largest critical dimension (CD) at the two swelling portions 12c.

Figure 10:
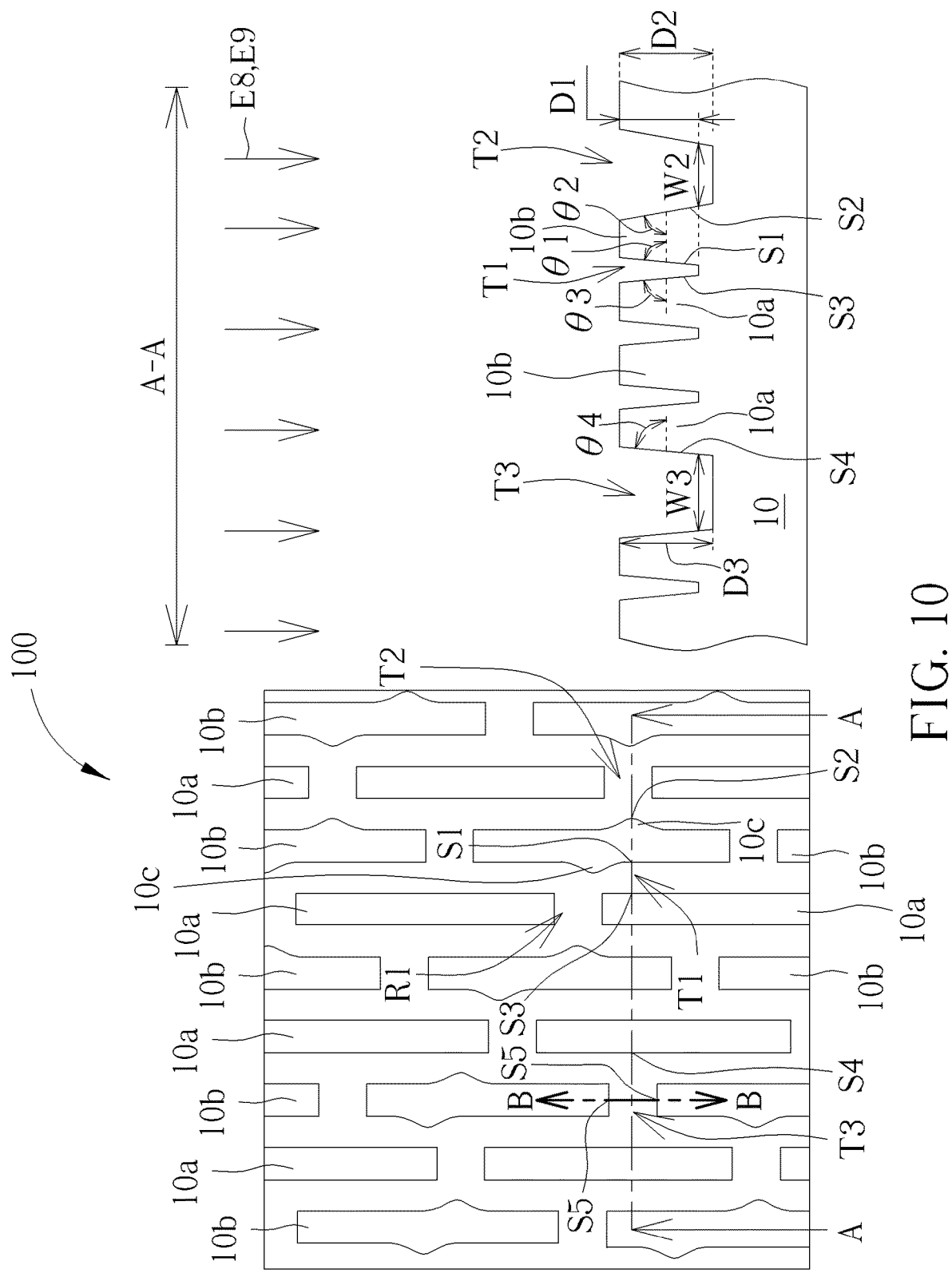

Please refer to FIG. 10. Subsequently, an etching process E8 such as a dry etching process may be performed to pattern the 10 by using the first oxide pattern 12a and the second oxide pattern 12b as an etching mask to etch and remove the exposed portions of the substrate 10 to form a plurality of trenches (such as trenches T1, T2 and T3) in the substrate 10, thereby transferring the array pattern 120 to the substrate 10 to form an array pattern 100. After the etching process E8, another etching process E9 such as a wet etching process may be performed to remove the remaining portions of the first oxide pattern 12a and the second oxide pattern 12b from the substrate 10. According to an embodiment, the etching process E8 may utilize HBr or HBr in combination with other gases to etch the substrate 10. The etching process E9 may utilize dHF to remove the remaining portion of the first oxide pattern 12a and the second oxide pattern 12b. As shown in FIG. 10, the array pattern 100 comprises a plurality of first active regions 10a corresponding to the first oxide pattern 12a and a plurality of second active regions 10b corresponding to the second oxide pattern 12b, and the first active regions 10a and the second active regions 10b may inherit the profiles of the first oxide pattern 12a and the second oxide patterns 12b, respectively.

Please continue to refer to FIG. 10. The dynamic random access memory (DRAM) provided by the present invention includes a substrate 10, a plurality of first active regions 10a disposed on the substrate 10 and arranged end-to-end along the first direction Y, and a plurality of second active regions 10b disposed between the first active regions 10a and arranged end-to-end along the first direction Y. The first active regions 10a and the second active regions 10b are staggered and alternately arranged along the second direction X, and are separated from each other by the first trenches T1. The ends of the first active regions 10a are separated from each other by the second trenches T2. The ends of the second active regions 10b are separated from each other by the third trenches T3. According to an embodiment, by controlling the fin cut process E5, the first active regions 10a and the second active regions 10b may have substantially a same length along the first direction Y.

The second active regions 10b may respectively have a first sidewall S1 adjacent the first trenches T1 and a second sidewall S2 (the sidewall of the swelling portion 10c) adjacent to the second trench T2. The second angle θ2 (the taper angle between the second sidewall S2 and the plane defined by the first direction Y and the second direction X) of the second sidewall S2 may be smaller than the first angle θ1 (the taper angle between the first sidewall S1 and the plane defined by the first direction Y and the second direction X) of first sidewall S1. In other words, the second sidewall S2 is taper than the first sidewall S1.

According to an embodiment, a profile roughness of the first active regions 10a and a profile roughness of the second active regions 10b may be different. More specifically, the second active regions 10b may respectively have two swelling portions 10c respectively corresponding and protruding toward one of the second trenches T2 between the ends of the first active regions 10a. The two swelling portions 10c of each of the second active regions 10b are not aligned along the second direction Y. The second active regions 10b may have a largest critical dimension (CD) at the two swelling portions 10c.

According to an embodiment, the first active regions 10a may respectively have a third sidewall S3 adjacent the first trench T1 and opposite to the first sidewall S1 of the second active region 10b. The first angle θ1 of the first sidewall S1 and the third angle θ3 (the taper angle between the third sidewall S3 and the plane defined by the first direction Y and the second direction X) of the third sidewall S3 may be substantially the same.

According to an embodiment, the first active regions 10a may respectively have a fourth sidewall S4 adjacent to the third trench T3. The fourth angle θ4 (the taper angle between the fourth sidewall S4 and the plane defined by the first direction Y and the second direction X) of the fourth sidewall S4 may be substantially the same or smaller than the third angle θ3 of the third sidewall S3 and the first angle θ1 of the first sidewall S1, and is larger than the second angle θ2 of the second sidewall S2. According to an embodiment, the fourth angle θ4 is larger than the second angle θ2 and smaller than the third angle θ3. In other words, the second sidewall S2 may be taper than the fourth sidewall S4, and the fourth sidewall S4 may be taper than the third sidewall S3.

According to an embodiment, because of different taper degrees of the first sidewalls S1, the second sidewalls S2, the third sidewalls S3 and the fourth sidewalls S4, and also because of larger spaces of the cut region R1, a depth D1 of the first trench T1 may be smaller than a depth R2 of the second trench T2. A depth R3 of the third trench T3 may be substantially the same as the depth R2 of the second trench T2. A width W2 of the second trench T2 may be smaller than a width W3 of the third trench T3 at the same depth from the upper surface of the substrate 10.

Figure 11:
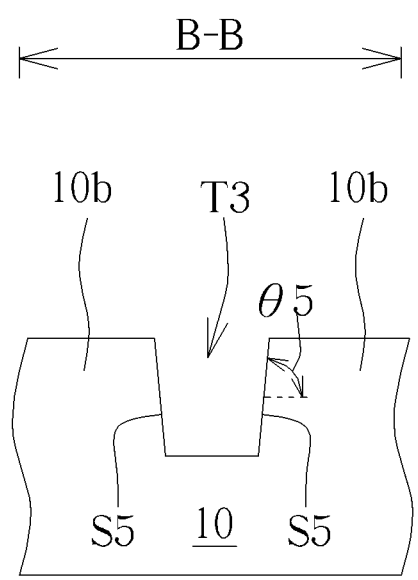
FIG. 11 illustrates another cross-sectional view of the dynamic random access memory shown in FIG. 10.

Please refer to FIG. 11. FIG. 11 shows a cross-sectional view of a portion of the DRAM taken along the line BB as shown in the top plan view in the left portion of FIG. 10. As shown in FIG. 11, the ends of the second active regions 10b adjacent to the third trench T3 respectively have a fifth sidewall S5. The fifth angle θ5 (the taper angle between the fifth sidewall S5 and the plane defined by the first direction Y and the second direction X) of the fifth sidewall S5 may substantially the same or larger than the fourth angle θ4 of the fourth sidewall S4 (see FIG. 10). According to an embodiment, the fifth angle θ5 is larger than the fourth angle θ4. According to an embodiment, the fifth angle θ5 may be substantially the same as the third angle θ3 (see FIG. 10).

In conclusion, by utilizing the mandrel structures MD to perform the self-aligned reverse pattern (SARP) process and utilizing the oxide layer 12, the polysilicon layer 14, and the nitride layer 16 to successively transfer the pattern to the substrate 10, the array pattern 100 of the dynamic random access memory (DRAM) which has half of the pitch of the mandrel structures MD may be obtained. More important, the second active regions 10b of the array pattern 100 may have a largest critical dimension (CD) at the swelling portions 10c without adversely influencing the electrical isolation between active regions due to reduced trench width.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM), comprising:
   a substrate;
   a plurality of first active regions disposed on the substrate and arranged end-to-end along a first direction; and
   a plurality of second active regions disposed between the first active regions and arranged end-to-end along the first direction and staggered with the first active regions along a second direction; and
   two swelling portions connected to opposite side edges of each of the second active regions and respectively protruding toward a second trench between the ends of the first active regions, wherein a distance along the second direction from one of the two swelling portions to a nearest one of the first active regions is smaller than a distance along the second direction between the second active regions and the first active regions.

2. The dynamic random access memory according to claim 1, wherein in a cross-sectional view along the second direction, the swelling portions respectively have a second sidewall, the second active regions respectively have a first sidewall opposite to the second sidewall and adjacent to a first trench between the second active region and one of the first active regions, and wherein a first angle of the first sidewall is larger than a second angle of the second sidewall.

3. The dynamic random access memory according to claim 2, wherein the first angle of the first sidewall of the second active region and a third angle of a third sidewall of the first active region adjacent to the first trench are substantially the same in the cross-sectional view.

4. The dynamic random access memory according to claim 3, wherein the first active regions respectively have a fourth sidewall adjacent to a third trench between the ends of the second active regions, wherein a fourth angle of the fourth sidewall of the first active region is smaller than the third angle of the third sidewall of the first active region in the cross-sectional view.

5. The dynamic random access memory according to claim 4, wherein the second angle of the second sidewall is smaller than the fourth angle of the fourth sidewall in the cross-sectional view.

6. The dynamic random access memory according to claim 4, wherein a width of the second trench is smaller than a width of the third trench in the cross-sectional view.

7. The dynamic random access memory according to claim 4, wherein the ends of the second active regions adjacent to the third trench respectively have a fifth sidewall in another cross-sectional view along the first direction, wherein a fifth angle of the fifth sidewall is substantially the same as the third angle of the third sidewall.

8. The dynamic random access memory according to claim 1, wherein the first active regions and the second active regions have a same length along the first direction.

9. The dynamic random access memory according to claim 2, wherein a depth of the first trench is smaller than a depth of the second trench.

10. The dynamic random access memory according to claim 1, wherein the two swelling portions are not aligned along the second direction.

11. The dynamic random access memory according to claim 1, wherein a profile roughness of the first active regions and a profile roughness of the second active regions are different from the top plan view.

12. A dynamic random access memory (DRAM), comprising:
   a substrate;
   a plurality of first active regions disposed on the substrate and arranged end-to-end along a first direction;
   a plurality of second active regions disposed between the first active regions and arranged end-to-end along the first direction and staggered with the first active regions along a second direction; and two swelling portions connected to opposite side edges of each of the second active regions, staggered to each other along the second direction, and respectively protruding toward a space between the ends of the first active regions, wherein a distance along the second direction between the swelling portions respectively connected to adjacent two of the second active regions is smaller than a distance along the second direction between adjacent two of the first active regions.

13. The dynamic random access memory (DRAM) according to claim 12, wherein one of the side edges of the second active regions has a first sidewall angle, one of the two swelling portions connected to the one of the side edges has a second sidewall angle, wherein the first sidewall angle is larger than the second sidewall angle.

14. The dynamic random access memory (DRAM) according to claim 12, wherein the swelling portions respectively protrude a width from the side edges of the second active regions along the second direction, and the width is smaller than a distance along the second direction between the second active regions and the first active regions.

* * * * *